(12) United States Patent
Nguyen et al.

(10) Patent No.: US 9,978,632 B2
(45) Date of Patent: May 22, 2018

(54) DIRECT LIFT PROCESS APPARATUS

(71) Applicant: Applied Materials, Inc., Santa Clara, CA (US)

(72) Inventors: Khiem Nguyen, San Jose, CA (US); Saravjeet Singh, Santa Clara, CA (US); Amitabh Sabharwal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 387 days.

(21) Appl. No.: 14/730,192

(22) Filed: Jun. 3, 2015

(65) Prior Publication Data

US 2015/0364347 A1  Dec. 17, 2015

Related U.S. Application Data

(60) Provisional application No. 62/012,159, filed on Jun. 13, 2014.

(51) Int. Cl.
*H01L 21/677* (2006.01)
*H01L 21/687* (2006.01)
*H01L 21/67* (2006.01)
*C23C 16/458* (2006.01)
*H01J 37/32* (2006.01)

(52) U.S. Cl.
CPC ...... *H01L 21/68742* (2013.01); *C23C 16/458* (2013.01); *H01J 37/32715* (2013.01); *H01J 37/32788* (2013.01)

(58) Field of Classification Search
CPC ......... H01L 21/68742; H01L 37/32715; H01L 37/32788; H01L 21/68707; H01L 21/67751; C23C 16/458–16/4585
See application file for complete search history.

(56) References Cited

U.S. PATENT DOCUMENTS

| | | | |
|---|---|---|---|
| 5,558,717 A * | 9/1996 | Zhao | C23C 16/4401 118/715 |
| 6,435,798 B1 * | 8/2002 | Satoh | C23C 16/4586 118/728 |
| 7,696,117 B2 | 4/2010 | Sun et al. | |
| 7,771,539 B2 * | 8/2010 | Lee | C23C 14/042 118/728 |
| 7,919,722 B2 * | 4/2011 | Ryabova | C04B 35/505 118/725 |

(Continued)

FOREIGN PATENT DOCUMENTS

WO   WO 2013024842 A1 *  2/2013 ....... H01L 21/68742

*Primary Examiner* — Rakesh K Dhingra
*Assistant Examiner* — Laureen Chan
(74) *Attorney, Agent, or Firm* — Patterson + Sheridan LLP (57) ABSTRACT

The present disclosure provides a substrate support assembly includes a substrate pedestal having an upper surface for receiving and supporting a substrate, a cover plate disposed on the substrate support pedestal, and two or more lift pins movably disposed through the substrate support pedestal and the cover plate. The cover plate includes a disk body having a central opening. The two or more lift pins are self supportive. Each of the two or more lift pins comprises one or more contact pads, and the contact pads of the lift pins extend into to the central opening of the cover plate to receive and support a substrate at an edge region of the substrate.

17 Claims, 7 Drawing Sheets

(56) References Cited

U.S. PATENT DOCUMENTS

| | | | |
|---|---|---|---|
| 2004/0045509 A1* | 3/2004 | Or | C23C 16/4401 |
| | | | 118/729 |
| 2005/0082007 A1* | 4/2005 | Nguyen | H01J 37/321 |
| | | | 156/345.51 |
| 2007/0160507 A1* | 7/2007 | Satoh | C23C 16/4586 |
| | | | 422/135 |
| 2008/0110397 A1* | 5/2008 | Son | H01L 21/68742 |
| | | | 118/500 |
| 2014/0213055 A1* | 7/2014 | Himori | H01L 21/68742 |
| | | | 438/689 |

* cited by examiner

DIRECT LIFT PROCESS APPARATUS

CROSS-REFERENCE TO RELATED APPLICATIONS

This application claims priority to U.S. Provisional Patent Application Ser. No. 62/012,159, filed on Jun. 13, 2014, which herein is incorporated by reference.

BACKGROUND

Field

Embodiments of the present disclosure relate to apparatus and methods for supporting and transferring substrates during photomask fabrication.

Description of the Related Art

Photomasks used in the patterning a substrate typically include a glass or quartz substrate having a patterned metal-containing layer. The patterned metal-containing layer is typically generated by etching with a radiation beam, such as a electron Photolithographic photomasks typically comprise a substrate of an optically transparent silicon based material, such as quartz. A light-shielding layer of metal, typically chromium, is patterned on the surface of the substrate. The metal layer is patterned and etched to form features which define the pattern, and correspond to the dimensions of the features to be transferred to a substrate, such as a semiconductor wafer.

During deposition and etching processes employed to fabricate the photomasks, substrates are transferred and supported within a processing system. Photomasks are sensitive to defects, such as scratches, and particles, because defects and particles may alter the light transmission properties of the photomasks.

Therefore, there is a need for a method and apparatus for transferring and supporting substrates in processing systems with reduced defects and particle generation.

SUMMARY

Embodiments of the present disclosure relate to apparatus and methods for transferring and supporting substrates during photomask fabrication.

One embodiment provides a substrate support assembly. The substrate support assembly includes a substrate pedestal having an upper surface for receiving and supporting a substrate, a cover plate disposed on the substrate support pedestal, and two or more lift pins movably disposed through the substrate support pedestal and the cover plate. The cover includes disk body having a central opening. The central opening surrounds the upper surface of the substrate pedestal. Each of the two or more lift pins comprises one or more contact pads, and the contact pads of the lift pins extend into to the central opening of the cover plate to receive and support a substrate at an edge region of the substrate.

Another embodiment provides a process chamber. The process chamber includes a chamber body enclosing a chamber volume, a plasma source positioned to generate a plasma in the chamber volume, and a substrate support assembly disposed in the chamber volume. The substrate support assembly includes a substrate pedestal having an upper surface for receiving and supporting a substrate in the chamber volume, a cover plate disposed on the substrate support pedestal, wherein the cover plate includes a disk body having a central opening, and the central opening surrounds the upper surface of the substrate pedestal, and two or more lift pins movably disposed through the substrate support pedestal and the cover plate, wherein each of the two or more lift pins comprises one or more contact pads, and the contact pads of the lift pins extend into to the central opening of the cover plate to receive and support a substrate at an edge region of the substrate.

Another embodiment provides a method for supporting and transferring a substrate. The method includes raising two or more lift pins above a cover plate disposed around a substrate pedestal having an upper surface for receiving and supporting a substrate, wherein the cover plate has a central opening surrounding the upper surface, and each of the two or more lift pins has one or more contact pads extending into the central opening of the cover plate, receiving a substrate with the two or more lift pins by supporting the substrate at an edge region with the contact pads on the two or more lift pins, and lowering the two or more lift pins into lift pin recesses formed in the cover plate to transfer the substrate onto the upper surface of the substrate pedestal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates apparatus and methods for handling photomasks, reticles or other substrates during fabrication. It should be noted that the terms "mask", "photomask" and "reticles" may be used interchangeably to denote generally a substrate containing a pattern.

More particularly, the present disclosure relates to lift pins with reduced contact areas and a cover plate used in a plasma process chamber. The lift pins according to the present disclosure may include a mounting pole that is self supportive without requiring external supporting structure.

The self supportive lift pins provide smooth and balanced movement and eliminate friction with additional supporting structure, thus reducing particle generation. The lift pins may include one or more contact pads for contacting substrates with reduced contact areas, thus reducing particle generation and lowering the possibility of scratching the substrate being handled. The cover plate of the present disclosure may be formed in one piece to improve uniformity in thermal coupling, improve radio frequency coupling and/or reduce particle generation.

Figure 1A:
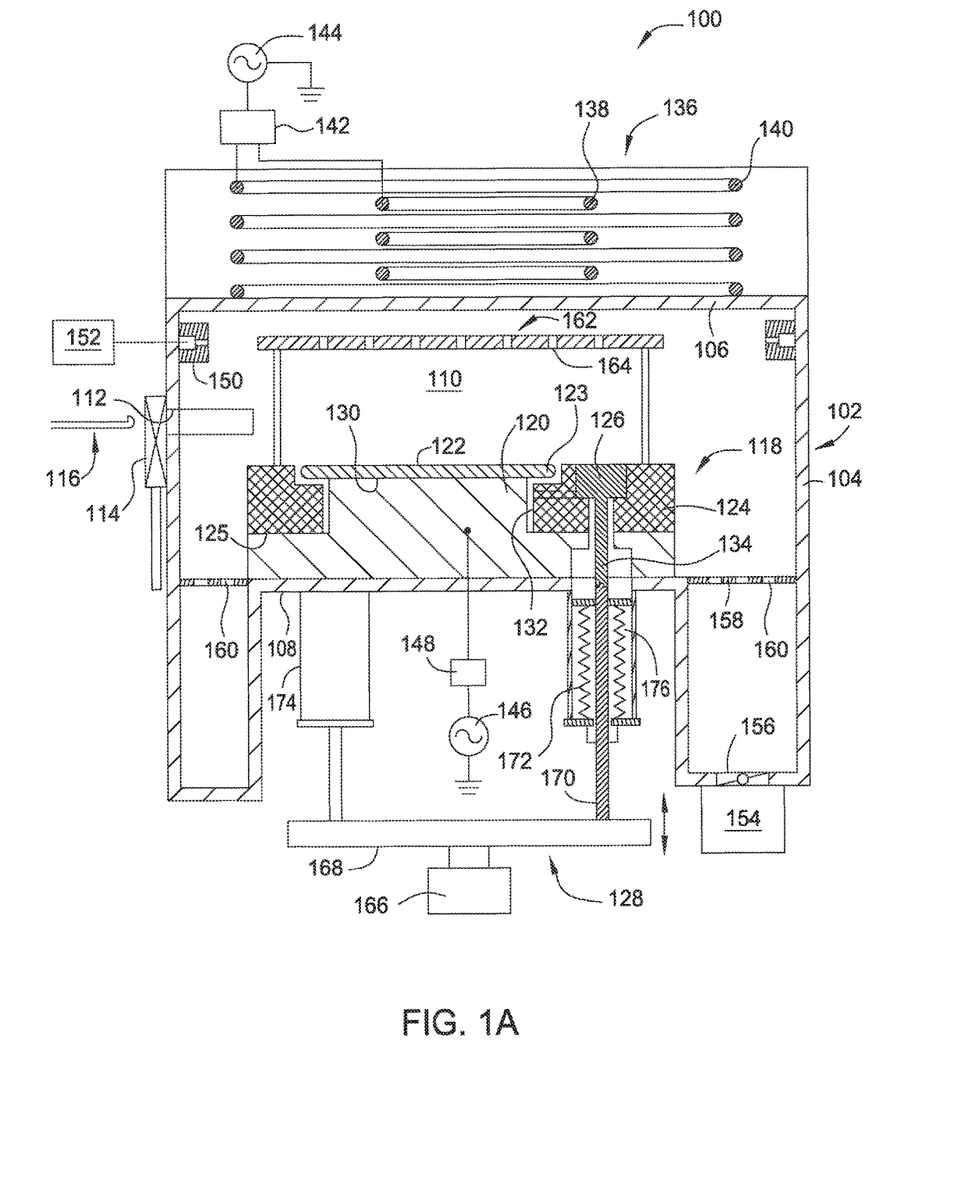
FIG. 1A is a schematic sectional view of a process chamber according to one embodiment of the present disclosure.

FIG. 1A is a schematic sectional view of a process chamber 100 according to one embodiment of the present disclosure. The process chamber 100 may be a plasma etch chamber to process photomasks.

The process chamber 100 generally includes a chamber body 102. The chamber body 102 may include chamber walls 104, a chamber lid 106 and a chamber bottom 108. The chamber body 102 defines a chamber volume 110 therein. The chamber walls 104 may have a slit valve opening 112 to allow a substrate handling robot 116 to pass therethrough for loading and unloading substrates. A slit valve door 114 may selectively open and close the slit valve opening 112.

A substrate support assembly 118 is disposed in the chamber body 102 to support and transfer a substrate 122 during processing. The substrate support assembly 118 may include a substrate pedestal 120. The substrate pedestal 120 may have an upper surface 130 to receive and support the substrate 122. The upper surface 130 may be smaller than the substrate 122 being processed so that an edge region 123 of the substrate 122 extends beyond the upper surface 130 when the substrate 122 is positioned on the substrate pedestal 120.

A cover plate 124 is disposed on the substrate pedestal 120. The cover plate 124 may be disposed on a shoulder 125 of the substrate pedestal 120. A central opening 132 of the cover plate 124 surrounds the upper surface 130 of the substrate pedestal 120.

Two or more lift pins 126 may be movably disposed through the substrate pedestal 120 and the cover plate 124. Each lift pin 126 may extend into the central opening 132 of the cover plate 124 to pick up the substrate 122 by the edge region 123. The process chamber 100 includes a lift pin drive assembly 128 configured to move the two or more lift pins 126 vertically in the chamber volume 110.

A plasma source 136 may be disposed over the chamber lid 106 for igniting and maintaining a plasma in the chamber volume 110. The plasma source 136 may include one or more inductive coil elements 138, 140. The inductive coil elements 138, 140 may be coupled to a power source 144 through a matching network 142. The power source 144 may be capable of producing up to about 3000 W at a tunable frequency in a range from about 50 kHz to about 13.56 MHz. The substrate pedestal 120 may be coupled to a biasing power source 146 through a matching network 148. The biasing power source 146 may include one or more radio frequency source, DC source or pulsed DC source to provide a biasing power to the plasma in the chamber volume 110. Even though an inductive coupled plasma source is illustrated in FIG. 1A, the process chamber 100 may include other forms of the plasma source, such as capacitive coupled plasma source, remote plasma source, or microwave plasma source.

The process chamber 100 further includes a gas injecting assembly 150 configured to deliver one or more processing gases in the chamber volume 110. In one embodiment, a gas source 152 may be coupled to the gas injecting assembly 150. A vacuum pump 154 may be coupled to the chamber volume 110 through a valve 156. The vacuum pump 154 may maintain a vacuum condition in the chamber volume 110 during processing.

A plasma screen 158 may be disposed round the substrate support assembly 118. The plasma screen 158 includes a plurality of openings 160 to enable a uniform vacuum power around the substrate support assembly 118. The plasma screen 158 may be formed from a conductive material to retain the plasma within an upper section of the chamber volume 110.

The process chamber 100 may further include a shield 162 disposed above the substrate support assembly 118. The shield 162 may be electrically isolated from the chamber body 102 and the substrate support 120. The shield 162 includes a plurality of apertures 164. The plurality of apertures 164 collectively provide an open area for controlling the amount of ions passing through.

The cover plate 124 may be formed in a unitary body to achieve improved thermal uniformity and RF uniformity and reduced particle generation in the process chamber 100. Alternatively, the cover plate 124 may include multiple parts. As shown in FIG. 1A, the cover plate 124 may be a unitary plate with the central opening 132 formed through a central region. A unitary cover plate is advantageous over cover plates formed by two or more pieces. The unitary cover plate 124 equalizes surface charge across the substrate pedestal 120, therefore, improving RF dielectric coupling uniformity. The unitary cover plate 124 provides improved thermal uniformity because there are not any interfaces within the cover plate 124 thus eliminating non-uniformity caused by non-uniform contact in the interfaces. The unitary cover plate 124 also improves thermal conductivities because of there are no interfaces. Furthermore, the unitary cover plate 124 also reduces particle generation because there are not any moving parts in the cover plate 124 to generate particles during processing.

The lift pins 126 of the present disclosure also reduce particle generation. Each lift pin 126 may include a solid mounting pole 134 to couple with the lift pin drive assembly 128 that is configured to move the lift pin 126 vertically in the chamber volume 110. The solid mounting pole 134 eliminates the need of a bushing around the lift pin 126 during motion. By eliminating the needs of a bushing, the lift pins 126 achieve smoother and more balanced substrate handling and also reduce particle generation resulted from bushing. Each lift pin 126 may include one or more substrate contact areas (further discussed with FIG. 1B) for receiving and supporting a substrate thereon. The one or more substrate contact areas may be reduced to limit contact areas thus reducing particle generation from substrate contact.

The lift pin drive assembly 128 may be disposed outside the chamber body 104 below the chamber bottom 108. In one embodiment, the lift pin drive assembly 128 may include an actuator 166 connected to a bracket 168. The actuator 166 is configured to move the bracket 168 vertically. Two or more lift pin holders 170 may be in contact with the bracket 168 to move with the bracket 168. Each lift pin holder 170 may extend through an inner volume 176 of a column 174 to couple with the solid mounting pole 134 of the lift pin 126. A bellows 172 may be disposed around each lift pin holder 170 in the inner volume 176. The actuator 166 moves the bracket 168 vertically, which then moves the lift pin holders 170 and the lift pins 126 vertically. Even though, the lift pin drive assembly 128 shown in FIG. 1A moves the two or more lift pins 126 together, suitable lift pin drive assemblies may be used to drive each of the two or more lift pins 126 individually.

Figure 1B:
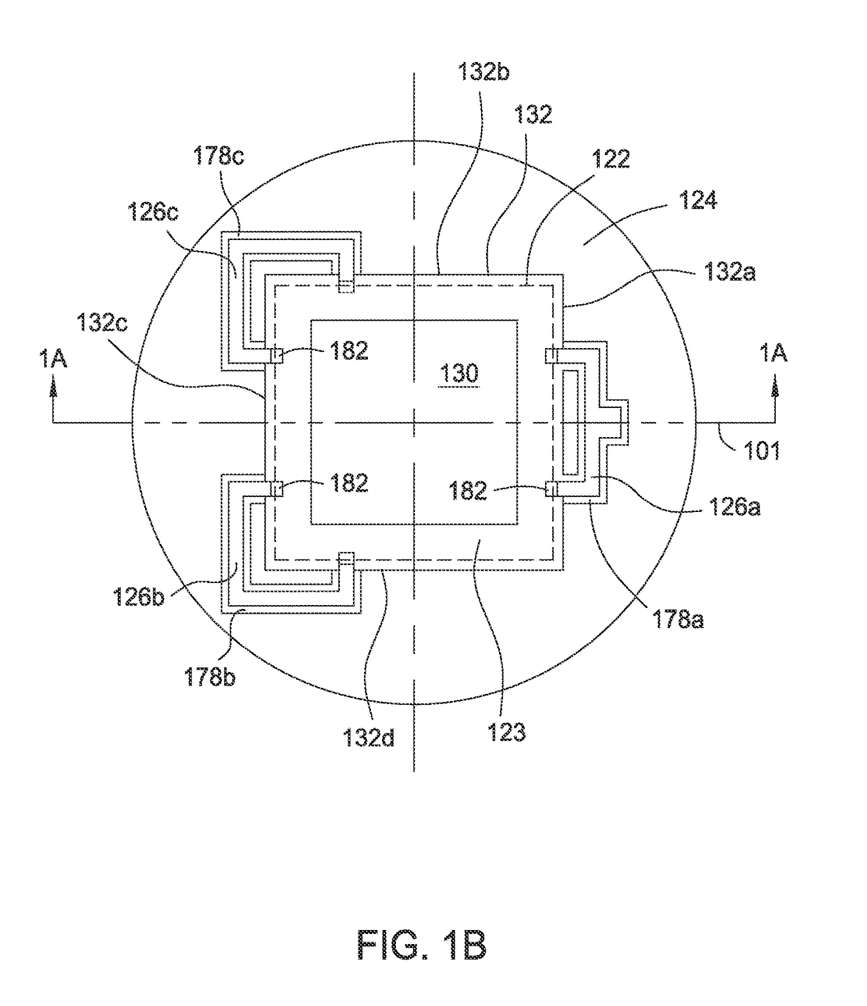
FIG. 1B is a top view of the cover plate and the lift pins in the process chamber of FIG. 1A.

FIG. 1B is a top view of the cover plate 124 and the lift pins 126 according to one embodiment of the present disclosure. The upper surface 130 of the substrate pedestal 120 may have a shape and dimensions that substantially match those of the substrate 122 being processed. In the embodiment shown in FIG. 1B, the upper surface 130 may be in a square shape for handling a square-shaped substrate. The upper surface 130 may be sized slightly smaller than the size of the substrate 122 so that the edge region 123 of the substrate 122 extends beyond the upper surface 130 of the substrate pedestal 120. The central opening 132 of the cover plate 124 is also a squared shape. The cover plate 124 is disposed on the substrate pedestal 120 so that the central opening 132 is aligned with and centered about the upper surface 130.

As shown in FIG. 1B, three lift pins 126a, 126b, and 126c are disposed through the cover plate 124. In one embodiment, three recesses 178a, 178b, 178c may be formed in the cover plate 124 to receive the lift pins 126a, 126b, 126c respectively when the lift pins 126a, 126b, 126c are in a lowered position, as shown in FIG. 1A. At a raised position, the lift pins 126a, 126b, 126c extend above from the cover plate 124.

Each lift pin 126a, 126c, 126c includes two contact pads 182 for contact with the substrate 122 at the edge region 123. The contact pads 182 of each lift pins 126a, 126b, 126c extend inwardly from the recesses 178a, 178b, 178c into the central opening 132 of the cover plate 124. The contact pads 182 may be arranged to provide a balanced support to the squared shaped substrate 122.

The lift pins 126a, 126b, 126c may be of different shapes. In the embodiment shown in FIG. 1B, the lift pin 126a may be disposed along a first side 132a of the central opening 132. The lift pin 126a is shaped to position the two contact pads 182 along the first side 132a. The two contact pads 182 of the lift pin 126a may be symmetrically positioned about a first axis 101 of the central opening 132. The lift pin 126b may be position around a corner of a second side 132b and a third side 132c of the central opening 132. In one embodiment, the lift pin 126a may be positioned along the first axis 101.

The lift pin 126b may be shaped to position two contact pads 182 along the second side 132b and the third side 132c respectively. The lift pin 126c may be position around a corner of the third side 132c and a fourth side 132d of the central opening 132. The lift pin 126c may be shaped to position two contact pads 182 along the third side 132c and the fourth side 132d respectively. In one embodiment, the contact pads 182 of the lift pins 126b, 126c may be symmetrical about the first axis 101. In one embodiment, the lift pins 126b, 126c may be shaped in mirror image of one another.

Figure 1C:
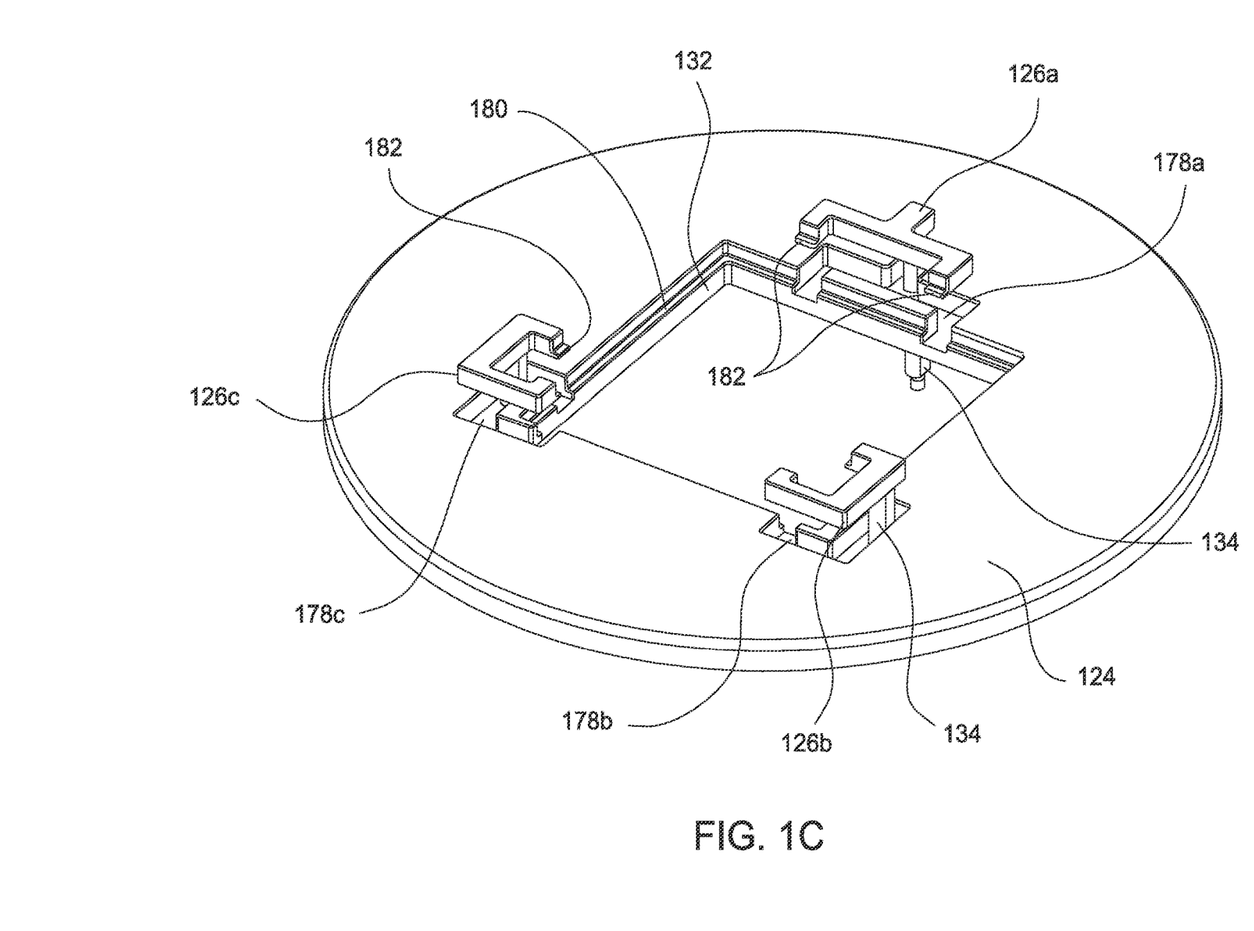
FIG. 1C is a schematic perspective view of the cover plate and the lift pins in the process chamber of FIG. 1A.
Figure 1D:
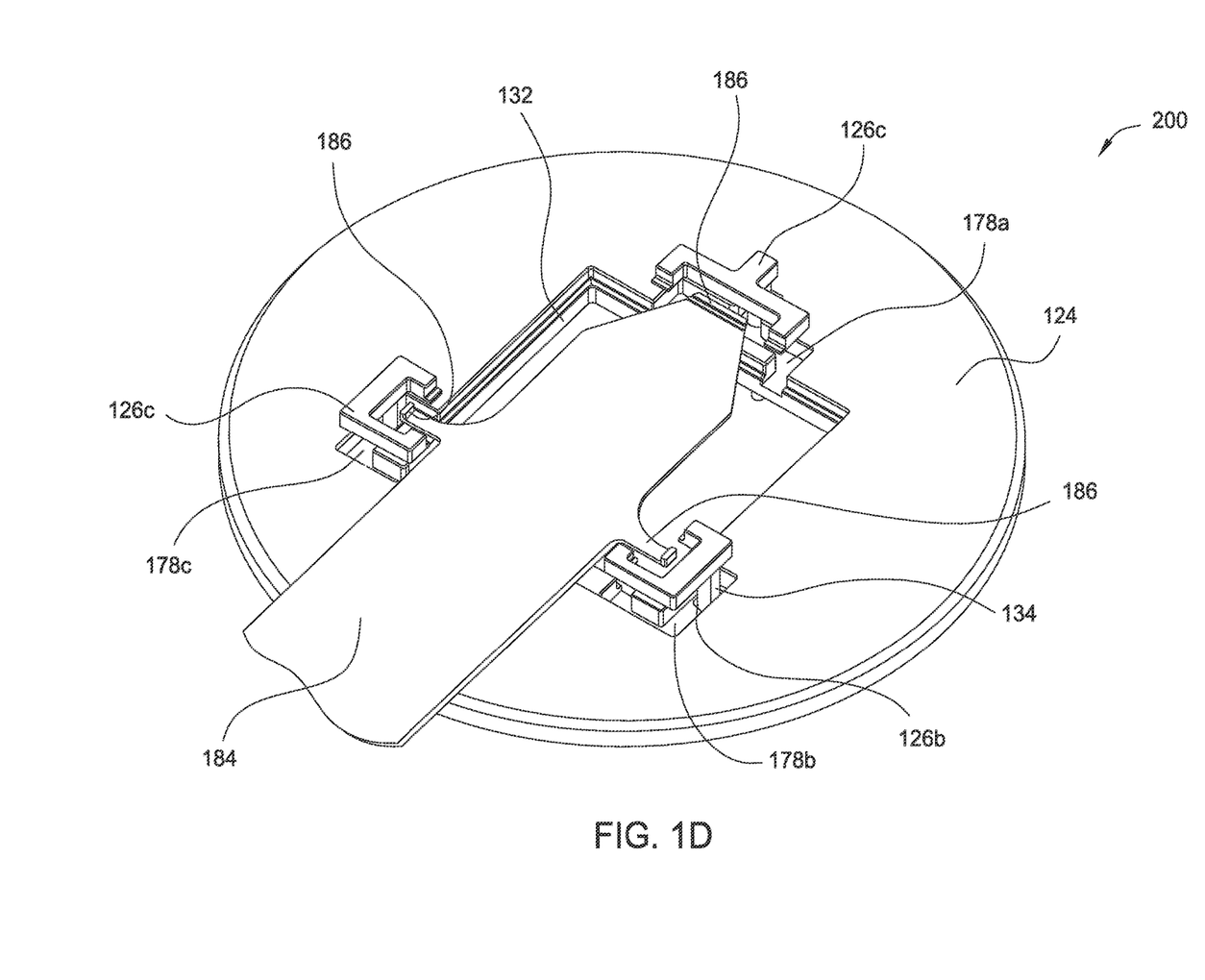
FIG. 1D is a schematic perspective view of the lift pins of FIG. 1A interacting with a substrate transfer robot blade.

FIG. 1C is a schematic perspective view of the cover plate 124 and the lift pins 126 showing the lift pins 126 in raised position. In the embodiment of FIG. 1C, the cover plate 124 has a step 180 formed in the central opening 130. The step 180 may overlap with the edge region 123 of the substrate 122 to provide improved coverage over the substrate pedestal 120. FIG. 1D is a schematic perspective view of the lift pins 126 relative to a substrate transfer blade 184 during substrate exchange. The substrate transfer blade 184 may belong to an external substrate handling tool, such as a robot, for transferring substrates in and out the process chamber 100. At the substrate exchange position shown in FIG. 1B, the lift pins 126 may move vertically relative to the substrate transfer blade 184 to exchange a substrate with the substrate transfer blade 184. In one embodiment, the substrate transfer blade 184 may include three fingers 186. At the substrate exchange position shown in FIG. 1D, the three fingers 186 of the substrate transfer robot 182 are directed towards the three lift pins 126 respectively. Each finger 186 may be positioned between the two contact pads 182 of the corresponding lift pin 126.

Figure 2:
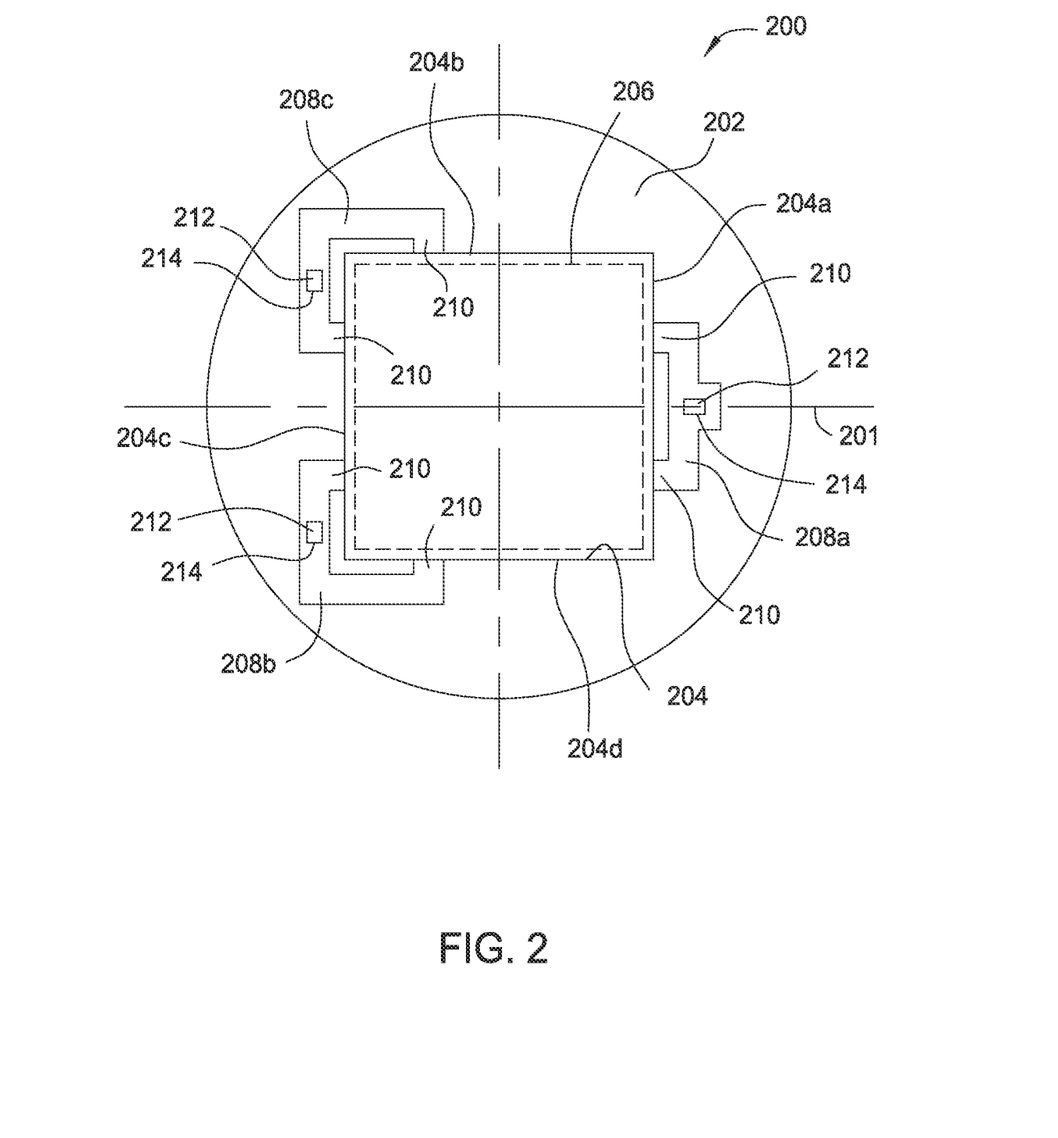
FIG. 2 is a schematic top view of a cover plate according to one embodiment of the present disclosure.

FIG. 2 is a schematic top view of a cover plate 200 according to one embodiment of the present disclosure. The cover plate 200 may be used in place of the cover plate 124 in the process chamber 100. The cover plate 200 may be disposed on a substrate support to cover portions of the substrate support not covered by the substrate to protect the substrate support from the process chemistry. The cover plate 200 may be formed in one or more pieces. The cover plate 200 when fabricated as a single piece of material provides improved thermal uniformity in thermal conductivity, improved RF couple uniformity during plasma processing, and reduced particle generation compared to cover plates formed from multiple pieces.

The cover plate 200 may have a disk body 202 having a central opening 204. The central opening 204 may be a through hole with a straight sidewall. In one embodiment, the central opening 204 may be a through hole with stepped sidewalls. The disk body 202 may be substantially circular for covering a circular shaped substrate support. The central opening 204 may be a square to surround a square-shaped substrate 206. Even though a circular cover plate with a square shaped central opening is described above, one piece cover plates that is non-circular or with a non-square shaped central opening may be used in non-circular process chambers or for processing non-square shaped substrates.

Lift pin recesses 208a, 208b, 208c may be formed on an upper side of the disk body 202. The lift pin recesses 208a, 208b, 208c are shaped to receive lift pins so that contact areas of the lift pins are position under the substrate 206 during processing and allow the lift pins to rise above the cover plate 200 to pick up the substrate 206 during substrate exchange. The lift pin recesses 208a, 208b, 208c may be shaped to match the shape of the corresponding lift pins, such as lift pins 126a, 126b, 126c of the process chamber 100. The lift pin recesses 208a, 208b, 208c allow the lift pins to be level with or recessed below the upper surface of the substrate pedestal, such as the upper surface 130 of the substrate pedestal 124, when the lift pins are retracted in the cover plate 200.

The lift pin recess 208a may be formed along a first side 204a of the central opening 204. The lift pin recess 208b may be formed around a corner of a second side 204b and a third side 204c of the central opening 204. The lift pin recess 208c may be formed around a corner of the third side 204c and a fourth side 204d of the central opening 204. Each lift pin recess 208a, 208b, 208c may include one or more notches 210 connected to the central opening 204. The one or more notches 210 allow contact pads of lift pins to extend into the central opening 204. For example, the notches 210 may allow the contact pads 182 of the lift pins 126 into the central opening 204.

A through hole 212 may be formed in each lift pin recess 208a, 208b, 208c. The through hole 212 is positioned to receive a mounting pole of a lift pin, such as the mounting pole 134 of the lift pin 126 described above. The through hole 212 allows the mounting pole of a lift pin to move vertically thus raising and lowering the lift pin. In one embodiment, the through hole 212 may include one or more flat surface 214 to provide alignment to the lift pin and prevent the lift pin from rotating about the mounting pole during vertical movement. The flat surface 214 may also function to maintain a predetermined orientation relative to the cover plate 200.

The cover plate 200 may be formed symmetrically to improve process symmetry and/or uniformity. In one embodiment, the cover plate 200 is symmetrical about a central axis 201.

The cover plate 200 may be formed from or coated with a material that is compatible with process chemistry and/or has suitable thermal properties and/or suitable electrical properties for the processes to be performed. For example, the cover plate 200 may comprise yttrium oxide (yttria), or a halogen containing plasma resistant material (HPM).

In one embodiment, the cover plate 200 comprises yttria. The cover plate may be formed from solid yttria. For example, the cover plate 200 may be formed by compacting yttria powder to a sample, sintering the sample, then machining the sintered sample into a desired shape and dimension. Alternatively, the cover plate 200 may include a yttria coating to reduce cost. The cover plate 200 may be formed by machining a base material, such as a metal, for example aluminum or stainless steel, to desired shape and dimension, and applying an yttria coating to the machined base material.

In another embodiment, the cover plate 200 comprises HPM. The HPM may yttrium oxide at a molar concentration ranging from about 50 mole % to about 75 mole %, zirconium oxide at a molar concentration ranging from about 10 mole % to about 30 mole %, and at least one other component, selected from the group consisting of aluminum oxide, hafnium oxide, scandium oxide, neodymium oxide, niobium oxide, samarium oxide, ytterbium oxide, erbium oxide, cerium oxide, and combinations thereof, at a molar concentration ranging from about 10 mole % to about 30 mole %. The cover plate may be formed from solid HPM by compacting articles of the HPM to a sample, sintering the sample, then machining the sintered sample into desired shape and dimension. Alternatively, the cover plate 200 may include a HPM coating to reduce cost. The cover plate 200 may be formed by machining a base material, such as a metal, for example aluminum or stainless steel, to desired shape and dimension, and applying a HPM coating to the machined base material.

Figure 3A:
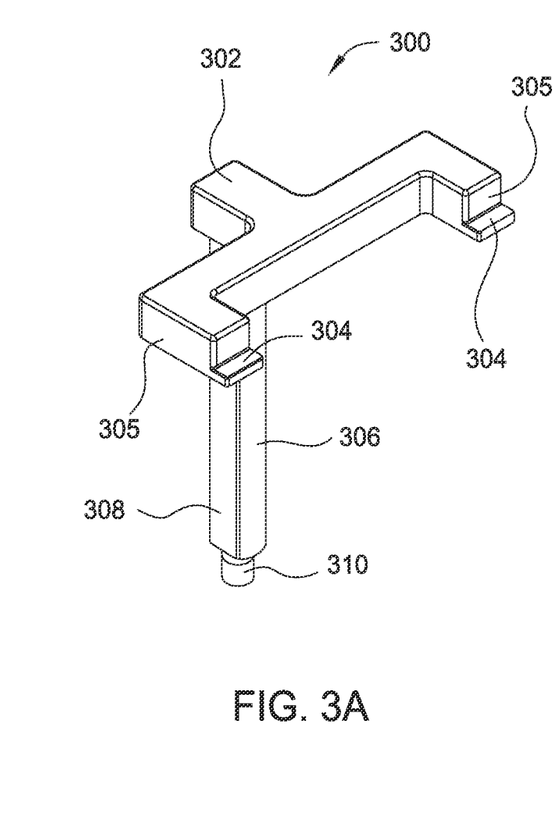
FIGS. 3A-3C are schematic perspective views of lift pins according to embodiments of the present disclosure.
Figure 3B:
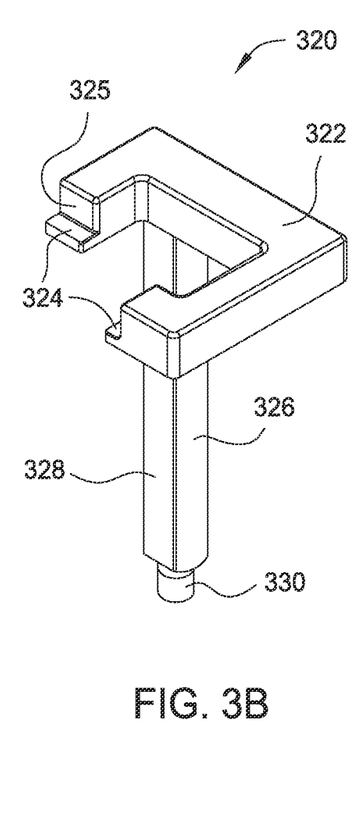
Figure 3C:
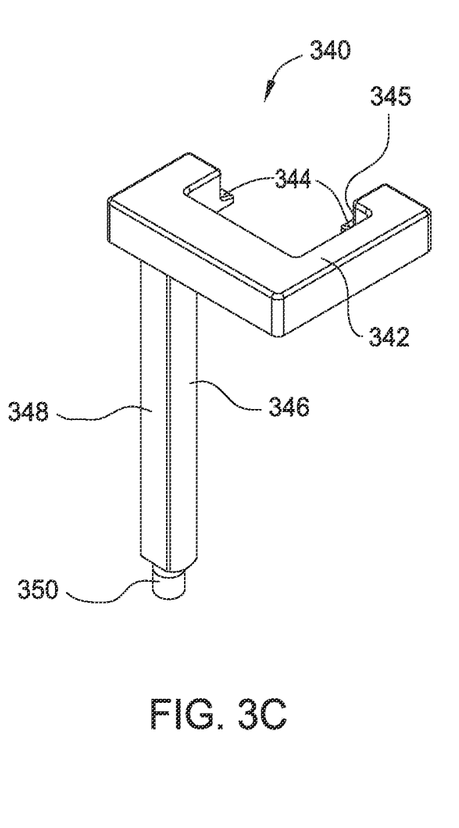

FIGS. 3A-3C are schematic perspective views of lift pins according to embodiments of the present disclosure. FIG. 3A schematically illustrates a lift pin 300. The lift pin 300 may be used in place of the lift pin 126a of the process chamber 100 and to fit with the lift pin recess 208a of the cover plate 200. The lift pin 300 may include a head portion 302 and a mounting pole 306 extending downwardly from the head portion 302. The head portion 302 may include contact pads 304 formed at a distal end of the head portion 302. Each contact pad 304 may include a planar area for contacting a backside of an edge region of a substrate. The contact pads 304 may be minimized to reduce contact area thus reducing particle generation and improving thermal uniformity. In one embodiment, a side wall 305 may be formed adjacent the contact pad 304 to guide or provide alignment to the substrate.

The mounting pole 306 may be a linear shaft having a first end extending from the head portion 302 and a second end configured to connect with a lift pin drive assembly, such as the lift pin drive assembly 128 of the process chamber 100. A drive adaptor 310 may be formed at the second end of the mounting pole 306 to connect the lift pin 300 with a lift pin drive assembly. In one embodiment, the mounting pole 306 may include at least one flat surface 308 that may be used for original alignment with a cover plate, such as the cover plate 200. The flat surface 308 may also function to maintain the head portion 302 of the lift pin 300 in a predetermined orientation relative to the central opening of the cover plate.

The mounting pole 306 may be a solid shaft that provides enough rigidity so that the lift pin 300 is self supportive without needing any additional structures, such as a bushing, to provide support, alignment and/or balancing structures. The mounting pole 306 may be positioned in a location relative to the head portion 302 to improve balance when the lift pin 300 stands alone or supports a substrate at the contact pads 304. In one embodiment, the lift pin 300 includes two contact pads 304. The contact pads 304 are located on opposite sides of the mounting pole 306 to improve balance when supporting a substrate.

FIG. 3B schematically illustrates a lift pin 320. The lift pin 320 may be used in place of the lift pin 126b of the process chamber 100 and to fit with the lift pin recess 208b of the cover plate 200. The lift pin 320 may include a head portion 322 and a mounting pole 326 extending downwardly from the head portion 322. The head portion 322 may include contact pads 324 formed at a distal end of the head portion 322. Each contact pad 324 may include a planar area for contacting a backside of an edge region of a substrate. The contact pads 324 may be minimized to reduce contact area thus reducing particle generation and improving thermal uniformity. In one embodiment, a side wall 325 may be formed adjacent the contact pad 324 to guide or provide alignment to the substrate.

The mounting pole 326 may be a linear shaft having a first end extending from the head portion 322 and a second end configured to connect with a lift pin drive assembly, such as the lift pin drive assembly 128 of the process chamber 100. A drive adaptor 330 may be formed at the second end of the mounting pole 326 to connect the lift pin 320 with a lift pin drive assembly. In one embodiment, the mounting pole 326 may include at least one flat surface 328 that may be used for alignment with a cover plate, such as the cover plate 200, during installation.

The mounting pole 326 may be a solid shaft that provides enough rigidity so that the lift pin 320 is self supportive without needing any additional structures, such as a bushing, to provide support, alignment and/or balancing structures. The mounting pole 326 may be positioned in a location relative to the head portion 322 to improve balance when the lift pin 320 stands alone or supports a substrate at the contact pads 324. In one embodiment, the lift pin 320 includes two contact pads 324. The contact pads 324 are located on opposite sides of the mounting pole 326 to improve balance when supporting a substrate.

FIG. 3C schematically illustrates a lift pin 340. The lift pin 340 may be used in place of the lift pin 126c of the process chamber 100 and to fit with the lift pin recess 208c of the cover plate 200. The lift pin 340 and the lift pin 320 are mirror images of each other. The lift pin 340 includes a head portion 342 and a mounting pole 346 extending downwardly from the head portion 342. The head portion 342 includes two contact pads 344. A side wall 345 may be formed adjacent the contact pad 344 to guide or provide alignment to the substrate. A drive adaptor 350 may be formed at an end of the mounting pole 346. The mounting pole 346 may include a flat surface 348 for alignment during installation.

In one embodiment, the lift pins 300, 320, 330 are each formed in one unitary piece to provide rigidity and eliminate any frictions between individual parts. The lift pins 300, 320, 330 may be formed from a material that is compatible with process chemistry and/or has suitable thermal properties and/or suitable electrical properties for the processes to be performed. For example, the lift pins 300, 320, 330 may comprise yttria or a HPM as described above. The lift pins 300, 320, 330 may be formed by compressing powder of yttria or HPM to form a sample, sintering the sample, and machining the sintered sample to achieve desired shape and dimension. Alternatively, the lift pins 300, 320, 330 may be formed by applying a yttria coating or HPM coating over a machined part formed from a base material, such as aluminum, stainless steel.

According to one embodiment of the present disclosure, the cover plate and lift pins may be formed from the same material to obtain substantially uniform thermal properties and/or electrical properties across the cover plate, therefore, improving process uniformity.

Figure 4:
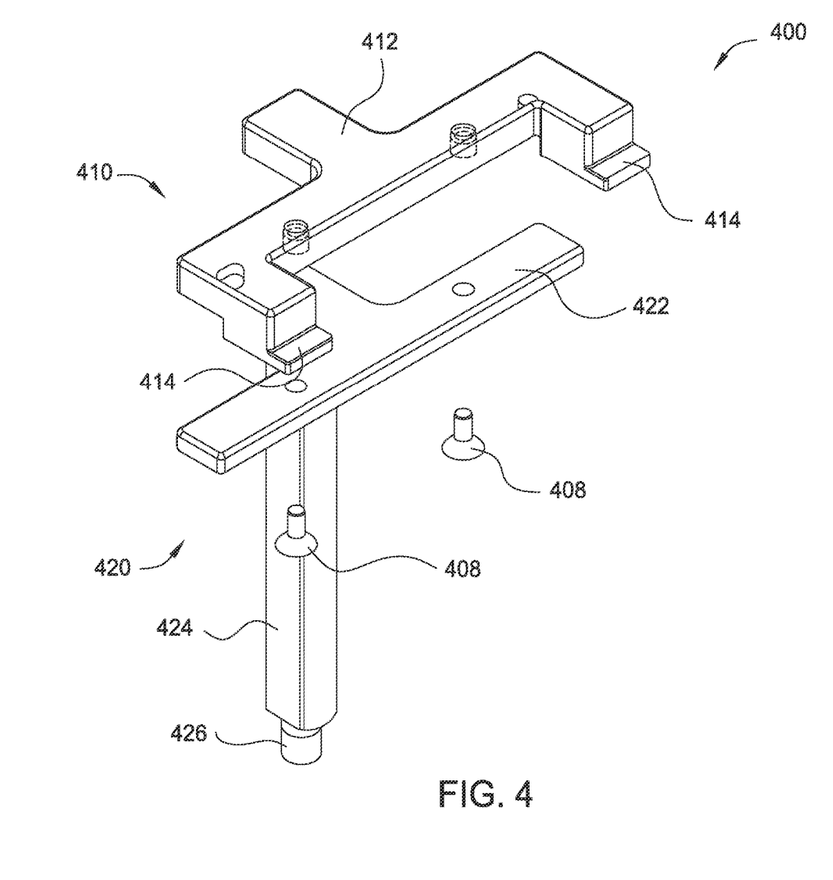
FIG. 4 is a schematic perspective view of a two-part lift pin according to one embodiment of the present disclosure.

FIG. 4 is a schematic perspective view of a two-part lift pin 400 according to one embodiment of the present disclosure. The lift pin 400 is similar to the lift pin 300 except that lift pin 400 includes a top portion 410 and a lower portion 420 joined together. As shown in FIG. 4, the top portion 410 and the lower portion 420 may be coupled together by fasteners, such as screws 408. Alternatively, the top portion 410 and the lower portion 420 may be joined together by other means, such as by adhesives, or by welding.

The top portion 410 may include a body 412 having two contact pads 414 for receiving and supporting a substrate. The lower portion 420 may include a head 422 attached to the top portion 410 and a mounting pole 424 extending from the flat portion. The one or more fasteners 408 may secure the head 422 to the top portion 410. A drive adaptor 426 may be formed at an end of the mounting pole 424.

The top portion 410 and the lower portion 420 may be formed from the same material or different materials. The two-part configuration makes it easier to manufacture thus reducing cost. In one embodiment, the top portion 410 may be formed from yttria or HPM while the lower portion 420 may be formed from a base material to further reduce cost. Similarly, the lift pins 320 and 340 may also be formed from two parts to reduce cost.

While the foregoing is directed to embodiments of the present disclosure, other and further embodiments of the disclosure may be devised without departing from the basic scope thereof, and the scope thereof is determined by the claims that follow.

The invention claimed is:

1. A substrate support assembly, comprising:
a substrate pedestal having an upper surface for receiving and supporting a substrate;
a cover plate disposed on the substrate support pedestal, wherein the cover plate includes a disk body having a central opening, and the central opening surrounds the upper surface of the substrate pedestal; and
two or more lift pins movably disposed through the substrate support pedestal and the cover plate, wherein each of the two or more lift pins comprises:
a head portion,
a mounting pole extending downwardly from the head portion, wherein the mounting pole includes a longitudinal axis, and
a first contact pad formed at a first distal end of the head portion and a second contact pad formed at a second distal end of the head portion, the first and second distal ends are distal from the longitudinal axis of the mounting pole, the first and second contact pads are orthogonally offset from the longitudinal axis of the mounting pole and extend laterally from the first and second distal ends into the central opening of the cover plate to receive and support a substrate at an edge region of the substrate.

2. The substrate support assembly of claim 1, wherein the cover plate has two or more lift pin recesses formed on an upper surface of the disk body, and each lift pin recess is shaped to receive a corresponding lift pin during processing and to allow the lift pin to rise above the cover plate during substrate exchange.

3. The substrate support assembly of claim 2, wherein the disk body has a circular shape, and the central opening is a square.

4. The substrate support assembly of claim 3, the two or more lift pins comprise a first lift pin, a second lift pin and a third lift pin, wherein the first lift pin is disposed along a first side of the central opening, the second and third lift pins are disposed around corners facing the first side of the central opening.

5. The substrate support assembly of claim 4, wherein the second lift pin and the third lift pin are mirror images of each other.

6. The substrate support assembly of claim 1, wherein the cover plate is formed from yttria or a halogen-containing plasma resistant material.

7. The substrate support assembly of claim 1, wherein the mounting pole has a flat surface formed in a cylindrical side wall.

8. The substrate support assembly of claim 1, wherein the lift pin is formed in one piece from yttria or halogen-containing plasma resistant material.

9. The substrate support assembly of claim 1, wherein the head portion is removably coupled to the mounting pole.

10. A process chamber, comprising:
a chamber body enclosing a chamber volume;
a plasma source positioned to generate a plasma in the chamber volume; and
a substrate support assembly disposed in the chamber volume, the substrate support assembly comprises:
a substrate pedestal having an upper surface for receiving and supporting a substrate in the chamber volume;
a cover plate disposed on the substrate support pedestal, wherein the cover plate comprises a disk body having a central opening, and the central opening surrounds the upper surface of the substrate pedestal; and
two or more lift pins movably disposed through the substrate pedestal and the cover plate, wherein each of the two or more lift pins comprises:
a head portion,
a mounting pole extending downwardly from the head portion, wherein the mounting pole includes a longitudinal axis, and
a first contact pad formed at a first distal end of the head portion and a second contact pad formed at a second distal end of the head portion, the first and second distal ends are distal from the longitudinal axis of the mounting pole, the first and second contact pads are orthogonally offset from the longitudinal axis of the mounting pole and extend laterally from the first and second distal ends into the central opening of the cover plate to receive and support a substrate at an edge region of the substrate.

11. The process chamber of claim 10, further comprising a lift pin drive assembly to move the two or more lift pins vertically in the chamber volume, wherein the lift pin drive assembly comprises:

two or more lift pin holders each coupled with a corresponding lift pin;

two or more bellows surrounding the two or more lift pin holders; and an actuator connected to the two or more lift pin holders.

12. The process chamber of claim 11, wherein the mounting pole of each of the two or more lift pins extends from the head portion through the cover plate and the substrate pedestal to couple with the lift pin holder of the lift pin drive assembly.

13. The process chamber of claim 12, wherein the mounting pole has a flat surface which maintains a predetermined orientation of the head portion relative to the central opening of the cover plate.

14. The process chamber of claim 10, wherein the cover plate has two or more lift pin recesses formed on an upper surface of the disk body, and each lift pin recess is shaped to receive a corresponding lift pin.

15. The process chamber of claim 14, wherein the disk body has a circular shape, and the central opening is a square, the two or more lift pins comprise a first lift pin, a second lift pin and a third lift pin, the first lift pin is disposed along a first side of the central opening, the second and third lift pins are disposed around corners facing the first side of the central opening.

16. The process chamber of claim 10, wherein the cover plate is formed from yttria or a halogen-containing plasma resistant material.

17. The process chamber of claim 16, wherein each of the two or more lift pins is formed from a single mass comprising yttria or halogen-containing plasma resistant material.

* * * * *

UNITED STATES PATENT AND TRADEMARK OFFICE
CERTIFICATE OF CORRECTION

PATENT NO. : 9,978,632 B2  
APPLICATION NO. : 14/730192  
DATED : May 22, 2018  
INVENTOR(S) : Khiem Nguyen et al.

Page 1 of 1

It is certified that error appears in the above-identified patent and that said Letters Patent is hereby corrected as shown below:

In the Claims

In Column 10, Line 44, in Claim 10, after "substrate" delete "support".

Signed and Sealed this
Tenth Day of July, 2018

Andrei Iancu
*Director of the United States Patent and Trademark Office*